(12) United States Patent
Imai

(10) Patent No.: US 7,265,372 B2
(45) Date of Patent: Sep. 4, 2007

(54) METHOD AND APPARATUS FOR IMAGE RECORDING AND IMAGE RECORDING MEDIUM

(75) Inventor: Shinji Imai, Kaisei-machi (JP)

(73) Assignee: Fujifilm Corporation, Tokyo (JP)

( * ) Notice: Subject to any disclaimer, the term of this patent is extended or adjusted under 35 U.S.C. 154(b) by 84 days.

(21) Appl. No.: 10/142,852

(22) Filed: May 13, 2002

(65) Prior Publication Data

US 2002/0168198 A1   Nov. 14, 2002

(30) Foreign Application Priority Data

May 11, 2001  (JP)  ............................. 2001-140871

(51) Int. Cl.
*G03B 42/08*   (2006.01)
(52) U.S. Cl. .................................... 250/591
(58) Field of Classification Search ................ 250/591
See application file for complete search history.

(56) References Cited

U.S. PATENT DOCUMENTS

| | | |
|---|---|---|
| 4,535,468 A | 8/1985 | Kempter |
| 5,332,893 A | 7/1994 | Potts et al. |
| 6,770,901 B1 * | 8/2004 | Ogawa et al. .............. 250/591 |

FOREIGN PATENT DOCUMENTS

| | | |
|---|---|---|
| EP | 1 041 400 A2 | 10/2000 |
| EP | 1 067 401 A2 | 1/2001 |
| JP | 2000-224377 | 8/2000 |
| JP | 2000-284056 | 10/2000 |

OTHER PUBLICATIONS

U.S. Appl. No. 09/539,412, filed Mar. 30, 2000, Ogawa et al.

* cited by examiner

*Primary Examiner*—David Porta
*Assistant Examiner*—Shun Lee
(74) *Attorney, Agent, or Firm*—Sughrue Mion, PLLC

(57) ABSTRACT

In a solid state radiation detector, an electrode layer, to which an electromagnetic wave for retrieval is irradiated, is formed by alternately arranging a first stripe electrode for transmitting the electromagnetic wave for retrieval and a second stripe electrode for shielding the same. Upon recording a radiation image, discharge breakdown of the first and the second stripe electrodes owing to application of a direct-current voltage is avoided. Upon recording a radiation image with the solid state radiation detector, when the direct-current voltage is applied between a first electrode layer and either the first stripe electrode or the second stripe electrode, leading and trailing edges of the direct-current voltage has variation with time, thus reducing electric currents flowing on the stripe electrodes, and a potential difference between an open end portion of each stripe electrode and either the first or the second stripe electrode adjacent thereto.

4 Claims, 7 Drawing Sheets

X-Z CROSS SECTION

X-Y CROSS SECTION

NON-IMAGING REGION | IMAGING REGION | NON-IMAGING REGION

METHOD AND APPARATUS FOR IMAGE RECORDING AND IMAGE RECORDING MEDIUM

BACKGROUND OF THE INVENTION

1. Field of the Invention

The present invention relates to a radiation image recording apparatus, which records an image as an electrostatic latent image by use of an image recording medium including an electric accumulator that accumulates electric charges in a quantity corresponding to an electromagnetic wave irradiated for recording electric charges as a latent image. The present invention also relates to the image recording medium.

2. Description of the Related Art

A conventionally-known method for use in radiation photography is a method utilizing, for example, a solid state radiation detector (an electrostatic recorder) having a photoconductor such as a selenium plate, which is sensitive to radiations such as X-rays, as an image recording medium including an electric accumulator that accumulates electric charges in a quantity corresponding to an electromagnetic wave irradiated for recording as electric charges for a latent image, in order to reduce radiation dosage of a test subject and to enhance diagnostic performances in medical radiography. In the foregoing method, radiation is irradiated onto the detector to allow the electric charges in a quantity corresponding to the irradiated radiation to be accumulated in the electric accumulator inside the detector, whereby a radiation image is recorded as an electrostatic latent image. Moreover, the radiation image is retrieved out of the detector by scanning the detector, which records the radiation image, with a laser beam or a line light source (such as U.S. Pat. No. 4,378,318, for example).

A solid state radiation detector has been disclosed in Japanese Unexamined Patent Publication No. 2000-284056, which is capable of combining high-speed response upon reading out and efficient extraction of signal charges. The solid state radiation detector disclosed in Japanese Unexamined Patent Publication No. 2000-284056 includes a first electrode layer which is transmissive of radiation for recording or light emitted due to excitation by the radiation, a recording photoconductive layer which takes on conductivity by receiving irradiation of the radiation for recording or the light, an electric accumulator which accumulates electric charges in a quantity corresponding to the irradiated radiation dosage as electric charges for a latent image, a retrieving photoconductive layer which takes on conductivity by receiving irradiation of an electromagnetic wave for retrieval, and a second electrode layer to which the electromagnetic wave for retrieval is irradiated, in which the foregoing constituents are stacked in accordance with the order of enumeration. Here, the second electrode layer further includes a first stripe electrode composed of multiple line electrodes that transmit the electromagnetic wave for retrieval, and a second stripe electrode for shielding the electromagnetic wave for retrieval, in which the first stripe electrode and the second stripe electrode are alternately arranged substantially in parallel.

In the above-described solid state radiation detector, if the radiation which passed through an imaging object is irradiated onto the first electrode layer of the above-described solid state radiation detector in the state that a voltage has been applied such that the first electrode layer is set to negative electric potential and the second electrode layer is set to positive electric potential, then charge pairs are generated on the recording photoconductive layer corresponding to the dosage of the radiation owing to irradiation of the radiation that passed through the first electrode layer. Accordingly, negative electric charges are accumulated in the electric accumulator as the electric charges for a latent image, whereby the radiation image is recorded as an electrostatic latent image. Moreover, in this event, if recording is performed in the state that the first stripe electrode and the second stripe electrode are set to the same electric potential by connecting the two stripe electrodes together, then the electric charges for a latent image are accumulated in the electric accumulator in positions corresponding to both electrodes.

Then, when the electromagnetic wave for retrieval is irradiated onto the second electrode layer of the above-described solid state radiation detector, then the electromagnetic wave passes through the first stripe electrode and is irradiated onto the retrieving photoconductive layer, whereby charge pairs are generated on the retrieving photoconductive layer. Among these charge pairs, positive electric charges thereof are coupled with the negative electric charges which were accumulated in the electric accumulator and negative electric charges thereof are coupled with positive electric charges which are charged on the first stripe electrode and the second stripe electrode. Accordingly, the electrostatic latent image is retrieved.

In addition, a method of enhancing retrieval efficiency in the course of recording with the above-described solid state radiation detector has been proposed. The method includes the steps of applying a direct-current voltage between the first electrode layer and the second stripe electrode layer, controlling distribution of an electric field formed in accordance with application of the voltage by applying a given controlling voltage to the first stripe electrode, and localizing the electric charges for a latent image accumulated in the electric accumulator into the electric accumulator in positions corresponding to the second stripe electrode to which current detection amplifiers are connected. Another method has been proposed, in which the electric charges for a latent image are localized and accumulated in the electric accumulator in the position corresponding to the second stripe electrode, not by applying the given controlling voltage to the first stripe electrode as described above, but by setting the electric potential of the first stripe electrode to an electric potential closer to the first electrode layer than the second stripe electrode by means of setting the first stripe electrode to an open state. Furthermore, in the above-described method, a similar effect is obtained when the voltages to be applied to the first stripe electrode and to the second stripe electrode are inverted from the foregoing. In other words, it is possible to localize and accumulate the electric charges for a latent image in the electric accumulator in the position corresponding to the first stripe electrode, by applying a direct-current voltage between the first electrode layer and the first stripe electrode, and then controlling distribution of an electric field formed in accordance with application of the voltage either by applying a given controlling voltage to the second stripe electrode or by setting the second stripe electrode to an open state.

However, when the radiation image is recorded by use of the above-described solid state radiation detector, the direct-current voltage for formation of the electric field is applied between the first electrode layer and at least one of the first stripe electrode and the second stripe electrode. In this event, the first stripe electrode and the second stripe electrode cannot ignore resistance possessed by the electrodes owing to the shapes thereof. Accordingly, a relatively large electric current flows on the first stripe electrode and the second stripe electrode owing to application of the high direct-current voltage, and the electric current causes potential differences on both ends of the respective stripe electrodes. Accordingly, if an end of each line electrode of the first stripe electrode is set as a grounded end and image signal obtaining means such as a current detection amplifier is connected to an end of the second stripe electrode in a position opposite from the grounded end (the second stripe electrode is grounded via an imaginary short of the current detection amplifier), for example, then the grounded end of the first stripe electrode and an open end of the second stripe electrode become adjacent and an open end of the first stripe electrode and the connecting end of the second stripe electrode to the image signal obtaining means (a grounded end) become adjacent. Accordingly, there is a risk of inducing discharge breakdown of the electrodes due to potential differences between the first stripe electrode and the second stripe electrode at the foregoing adjacent portions. Moreover, the risk of the discharge breakdown is increased in the case of recording while applying the controlling voltage to the first stripe electrode or the second stripe electrode or in the case of recording while setting the first stripe electrode or the second stripe electrode to the open state, because the above-described potential difference may be further increased in those cases.

Meanwhile, it is conceivable to provide an insulating layer for insulating the first stripe electrode and the second stripe electrode for the avoidance of the discharge breakdown. However, if the insulating layer is provided, the electric charges for a latent image will be retrieved through the insulating layer. Accordingly, there is a problem of inducing degradation of signal detection efficiency.

SUMMARY OF THE INVENTION

In consideration of the foregoing problems, an object of the present invention is to provide a method and an apparatus for image recording which are capable of avoiding the discharge breakdown of an image recording medium having stripe electrodes such as the above-described solid state radiation detector without degrading the signal detection efficiency thereof, and to provide an image recording medium achieving the same.

A first image recording method according to the present invention concerns an image recording method using an image recording medium, which includes: a first electrode layer which transmits an electromagnetic wave for recording; a recording photoconductive layer which takes on conductivity by receiving irradiation of the electromagnetic wave for recording; an electric accumulator which accumulates electric charges for a latent image generated on the recording photoconductive layer; a retrieving photoconductive layer which takes on conductivity by receiving irradiation of an electromagnetic wave for retrieval; and a second electrode layer to which the electromagnetic wave for retrieval is irradiated, the second electrode layer having a first stripe electrode composed of multiple line electrodes for generation of photoelectric charge pairs with respect to irradiation of the electromagnetic wave for retrieval and a second stripe electrode composed of multiple line electrodes for non-generation of the photoelectric charge pairs with respect to the electromagnetic wave for retrieval, wherein the first stripe electrode and the second stripe electrode are alternately arranged substantially in parallel in the second electrode layer. Here, the image recording medium is formed by stacking the foregoing constituents in accordance with the above order of enumeration. The image recording method records an image on the electric accumulator as an electrostatic latent image, by applying a direct-current voltage between the first electrode layer and at least one of the first stripe electrode layer and the second stripe electrode of the image recording medium, irradiating the electromagnetic wave for recording, and accumulating electric charges of a latent image corresponding to the irradiated electromagnetic wave for recording. Here, the first image recording method is characterized in that a leading edge of the direct-current voltage is provided with variation with time upon application of the direct-current voltage.

A second image recording method according to the present invention also concerns the image recording method using an image recording medium, which includes; a first electrode layer which transmits an electromagnetic wave for recording; a recording photoconductive layer which takes on conductivity by receiving irradiation of the electromagnetic wave for recording; an electric accumulator which accumulates electric charges for a latent image generated on the recording photoconductive layer; a retrieving photoconductive layer which takes on conductivity by receiving irradiation of an electromagnetic wave for retrieval; and a second electrode layer to which the electromagnetic wave for retrieval is irradiated, the second electrode layer having a first stripe electrode composed of multiple line electrodes for generation of photoelectric charge pairs with respect to irradiation of the electromagnetic wave for retrieval and a second stripe electrode composed of multiple line electrodes for non-generation of the photoelectric charge pairs with respect to the electromagnetic wave for retrieval, wherein the first stripe electrode and the second stripe electrode are alternately arranged substantially in parallel. Here, the image recording medium is formed by stacking the foregoing constituents in accordance with the above order of enumeration. The image recording method records an image on the electric accumulator as an electrostatic latent image, by applying a direct-current voltage between the first electrode layer and at least one of the first stripe electrode and the second stripe electrode of the image recording medium, irradiating the electromagnetic wave for recording, and accumulating electric charges for a latent image corresponding to the irradiated electromagnetic wave for recording on the electric accumulator. Here, the second image recording method is characterized in that a trailing edge of the direct-current voltage is provided with variation with time upon discontinuation of application of the direct-current voltage after accumulating the electric charges for a latent image.

Moreover, the variation with time in the first or the second image recording method may be set to 500 V/ms or less.

A first image recording apparatus according to the present invention concerns an image recording apparatus including: an image recording medium having a first electrode layer which transmits an electromagnetic wave for recording, a recording photoconductive layer which takes on conductivity by receiving irradiation of the electromagnetic wave for recording, an electric accumulator which accumulates electric charges for a latent image generated on the recording photoconductive layer, a retrieving photoconductive layer which takes on conductivity by receiving irradiation of an electromagnetic wave for retrieval, and a second electrode layer to which the electromagnetic wave for retrieval is irradiated, the second electrode layer having a first stripe electrode composed of multiple line electrodes for generation of photoelectric charge pairs with respect to irradiation of the electromagnetic wave for retrieval and a second stripe electrode composed of multiple line electrodes for non-generation of the photoelectric charge pairs with respect to the electromagnetic wave for retrieval, wherein the first stripe electrode and the second stripe electrode are alternately arranged substantially in parallel, and the image recording medium being formed by stacking the foregoing constituents in accordance with the above order of enumeration; and voltage applying means for applying a direct-current voltage between the first electrode layer and at least one of the first stripe electrode and the second stripe electrode of the image recording medium. The image recording apparatus records an image on the electric accumulator as an electrostatic latent image, by applying radiation of the electromagnetic wave for recording in a state that the direct-current voltage is applied by the voltage applying means and accumulating electric charges for a latent image corresponding to the electromagnetic wave on the electric accumulator. Here, the first image recording apparatus is characterized in that a leading edge of the direct-current voltage applied by the voltage applying means is provided with variation with time.

A second image recording apparatus according to the present invention also concerns an image recording apparatus including: an image recording medium having a first electrode layer which transmits an electromagnetic wave for recording, a recording photoconductive layer which takes on conductivity by receiving irradiation of the electromagnetic wave for recording, an electric accumulator which accumulates electric charges for a latent image generated on the recording photoconductive layer, a retrieving photoconductive layer which takes on conductivity by receiving irradiation of an electromagnetic wave for retrieval, and a second electrode layer to which the electromagnetic wave for retrieval is irradiated, the second electrode layer having a first stripe electrode composed of multiple line electrodes for generation of photoelectric charge pairs with respect to irradiation of the electromagnetic wave for retrieval and a second stripe electrode composed of multiple line electrodes for non-generation of the photoelectric charge pairs with respect to the electromagnetic wave for retrieval, wherein the first stripe electrode and the second stripe electrode are alternately arranged substantially in parallel, and the image recording medium being formed by stacking the foregoing constituents in accordance with the above order of enumeration; and voltage applying means for applying a direct-current voltage between the first electrode layer and at least one of the first stripe electrode and the second stripe electrode of the image recording medium. The image recording apparatus records an image on the electric accumulator as an electrostatic latent image, by applying irradiation of the electromagnetic wave for recording in a state that the direct-current voltage is applied by the voltage applying means and accumulating electric charges for a latent image corresponding to the electromagnetic wave on the electric accumulator. Here, the second image recording apparatus is characterized in that a trailing edge of the direct-current voltage applied by the voltage applying means is provided with variation with time upon discontinuation of application of the direct-current voltage after accumulating the electric charges for a latent image.

Moreover, the variation with time in the first or the second image recording apparatus may be set to 500 V/ms or less.

Here, in the first and second image recording methods and image recording apparatus, the foregoing "electromagnetic wave for recording" refers to light bearing image information to be recorded, such as radiation for recording which bears a radiation image of an imaging object or light generated inside a scintillator (a phosphor) by irradiating the radiation for recording onto the scintillator.

Moreover, the foregoing "first stripe electrode composed of multiple line electrodes for generation of photoelectric charge pairs" refers to an electrode which allows the electromagnetic wave for retrieval to pass therethrough and generates charge pairs on the retrieving photoconductive layer. Meanwhile, the foregoing "second stripe electrode composed of multiple line electrodes for non-generation of photoelectric charge pairs" refers to an electrode which shields the electromagnetic wave for retrieval and does not generate the charge pairs on the retrieving photoconductive layer. However, the second stripe electrode is not always limited to that which completely shields the electromagnetic wave and generates no charge pairs, but also includes an electrode which can transmit a certain extent of the electromagnetic wave as long as the degree of the charge pairs generated thereby are practically insignificant. Therefore, the charge pairs generated on the retrieving photoconductive layer are not entirely limited to those attributable to the electromagnetic wave which passed through the first stripe electrode, but the charge pairs may be also generated on the retrieving photoconductive layer slightly by the electromagnetic wave which passed through the second stripe electrode.

Furthermore, in the first image recording method and the first image recording device, the foregoing "leading edge of the direct-current voltage" refers to variation of a voltage upon application of the direct-current voltage.

Furthermore, the foregoing "leading edge of the direct-current voltage is provided with variation with time" refers to an operation of gradually varying magnitude of the applied voltage up to a desired voltage value during a predetermined time period upon application of the direct-current voltage, but not by sharply varying the magnitude of the applied voltage stepwise.

Furthermore, in the second image recording method and the second image recording device, the foregoing "trailing edge of the direct-current voltage" refers to variation of the voltage upon discontinuation of application of the direct-current voltage.

Furthermore, the foregoing "trailing edge of the direct-current voltage is provided with variation with time" refers to an operation of gradually varying the magnitude of the applied voltage down below a desired voltage value during a predetermined time period upon discontinuation of application of the direct-current voltage, but not by sharply varying the magnitude of the applied voltage stepwise down below the desired voltage value.

A first image recording medium according to the present invention concerns an image recording medium including: a first electrode layer which transmits an electromagnetic wave for recording; a recording photoconductive layer which takes on conductivity by receiving irradiation of the electromagnetic wave for recording; an electric accumulator which accumulates electric charges for a latent image generated on the recording photoconductive layer; a retrieving photoconductive layer which takes on conductivity by receiving irradiation of an electromagnetic wave for retrieval; and a second electrode layer to which the electromagnetic wave for retrieval is irradiated, the second electrode layer having a first stripe electrode composed of multiple line electrodes for generation of photoelectric charge pairs with respect to irradiation of the electromagnetic wave for retrieval and a second stripe electrode composed of multiple line electrodes for non-generation of the photoelectric charge pairs with respect to the electromagnetic wave for retrieval, wherein the first stripe electrode and the second stripe electrode are alternately arranged substantially in parallel, and the image recording medium being formed by stacking the foregoing constituents in accordance with the above order of enumeration. Here, the first image recording medium is characterized in that the first stripe electrode is composed of a connection line which connects the line electrode, of which one end is an open end, to the other end thereof; the second electrode is composed of a connection line which connects the line electrode to each of both ends thereof; and an insulating layer is provided between the first stripe electrode and the second stripe electrode for insulating the first stripe electrode and the second stripe electrode, covering at least the upper surface of either the first stripe electrode or the second stripe electrode, only at a first end region including the open end of the first stripe electrode and a portion of the second stripe electrode adjacent to the open end, and a second end region including the intersection of the connection line of one of the stripe electrodes and the line electrode of the other stripe electrode.

A second image recording medium according to the present invention also concerns an image recording medium including: a first electrode layer which transmits an electromagnetic wave for recording; a recording photoconductive layer which takes on conductivity by receiving irradiation of the electromagnetic wave for recording; an electric accumulator which accumulates electric charges for a latent image generated on the recording photoconductive layer; a retrieving photoconductive layer which takes on conductivity by receiving irradiation of an electromagnetic wave for retrieval; and a second electrode layer to which the electromagnetic wave for retrieval is irradiated, the second electrode layer having a first stripe electrode composed of multiple line electrodes for generation of photoelectric charge pairs with respect to irradiation of the electromagnetic wave for retrieval and a second stripe electrode composed of multiple line electrodes for non-generation of the photoelectric charge pairs with respect to the electromagnetic wave for retrieval, wherein the first stripe electrode and the second stripe electrode are alternately arranged substantially in parallel, and the image recording medium being formed by stacking the foregoing constituents in accordance with the above order of enumeration. Here, the second image recording medium is characterized in that the first stripe electrode is composed of a connection line which connects the line electrode to each of both ends thereof; the second electrode is composed of a connection line which connects the line electrode, of which one end is an open end, to the other end thereof; an insulating layer is provided between the first stripe electrode and the second stripe electrode for insulating the first stripe electrode and the second stripe electrode, covering at least the upper surface of either the first stripe electrode or the second stripe electrode, only at a first end region including the open end of the second stripe electrode and a portion of the first stripe electrode adjacent to the open end, and a second end region including the intersection of the connection line of one of the stripe electrodes and the line electrode of the other stripe electrode.

A third image recording medium according to the present invention also concerns the image recording medium including: a first electrode layer which transmits an electromagnetic wave for recording; a recording photoconductive layer which takes on conductivity by receiving irradiation of the electromagnetic wave for recording; an electric accumulator which accumulates electric charges for a latent image generated on the recording photoconductive layer; a retrieving photoconductive layer which takes on conductivity by receiving irradiation of an electromagnetic wave for retrieval; and a second electrode layer to which the electromagnetic wave for retrieval is irradiated, the second electrode layer having a first stripe electrode composed of multiple line electrodes for generation of photoelectric charge pairs with respect to irradiation of the electromagnetic wave for retrieval and a second stripe electrode composed of multiple line electrodes for non-generation of the photoelectric charge pairs with respect to the electromagnetic wave for retrieval, wherein the first stripe electrode and the second stripe electrode are alternately arranged substantially in parallel, and the image recording medium being formed by stacking the foregoing constituents in accordance with the above order of enumeration. Here, the third image recording medium is characterized in that one end of the line electrode that composes the first stripe electrode as well as an end of the line electrode that composes the second striped electrode located opposite from said one end of the line electrode that composes the first stripe electrode are an open ends; and an insulating layer is provided between the first stripe electrode and the second stripe electrode for insulating the first stripe electrode and the second stripe electrode, covering at least the upper surface of either the first stripe electrode or the second stripe electrode, only in at least one of two end regions, the first end region including the open end of the first stripe electrode and a portion of the second stripe electrode adjacent to said open end, and the second end region including the open end of the second stripe electrode and a portion of the first stripe electrode adjacent to said open end.

Moreover, in the first through the third image recording media, the end portion region may be defined as a non-image region.

Here, in the first through the third image recording media, the foregoing "open end" refers to an end in a state that nothing is connected thereto.

Furthermore, the foregoing "non-image region" refers to a region of the first electrode layer to which the electromagnetic wave for recording is not irradiated or to a region of the second electrode layer corresponding to the region of the first layer to which the electromagnetic wave for recording which bears an image is not irradiated.

Further, with regard to the first and second image recording mediums, the foregoing "connection line" refers to a line that connects the line electrode to ground or to an amplifier or the like. In addition, a common line may be formed by connecting connection lines connected to the same stripe electrode to each other.

According to the first image recording method and the first image recording apparatus of the present invention, when recording is performed as described above by use of the image recording medium, the leading edge of the direct-current voltage is provided with variation with time upon application of the direct-current voltage to be applied between the first electrode layer and at least one of the first stripe electrode and the second stripe electrode. Therefore, it is possible to reduce electric currents flowing on the stripe electrodes caused by application of the direct-current voltage and to reduce a potential difference generated between the open end portion of each of the stripe electrodes and the first or the second stripe electrode adjacent to the relevant open end portion. Accordingly, discharge breakdown can be avoided.

According to the second image recording method and the second image recording apparatus of the present invention, when recording is performed as described above by use of the image recording medium, the trailing edge of the direct-current voltage is provided with variation with time upon discontinuation of application of the direct-current voltage to be applied between the first electrode layer and at least one of the first stripe electrode and the second stripe electrode after accumulating the electric charges for a latent image in the electric accumulator. Therefore, it is possible to reduce electric currents flowing on the stripe electrodes caused by discontinuation of application of the direct-current voltage and to reduce a potential difference generated between the open end portion of each of the stripe electrodes and the first or the second stripe electrode adjacent to the relevant open end portion. Accordingly, discharge breakdown can be avoided in a similar manner to that of the first image recording method and the first image recording apparatus.

According to the first through third image recording mediums of the present invention, an insulating layer for insulating the first stripe electrode and the second stripe electrode has been provided only at the end regions including the open end of either the first stripe electrode or the second stripe electrode. Therefore, a reduction in signal detection efficiency due to providing an insulating layer on an image region is precluded, while discharge breakdown during application and cessation of the direct current voltage between the first stripe electrode and the first electrode layer for recording can be avoided.

In addition, there is a risk that the discharge breakdown occurs not only during application and discontinuation of application of the direct-current voltage, but also in the event of irradiation of the electromagnetic wave for recording, which is attributable to variation of electric potential of the first stripe electrode and the second stripe electrode owing to generation of the charge pairs inside the recording photoconductive layer. The first through the third image recording media can avoid not only the discharge breakdown upon application of the direct-current voltage, but also the discharge breakdown upon irradiation of the electromagnetic wave for recording.

DESCRIPTION OF THE PREFERRED EMBODIMENTS

Hereinafter, description will be made regarding the preferred embodiments of the present invention with reference to the accompanying drawings.

Figure 1:
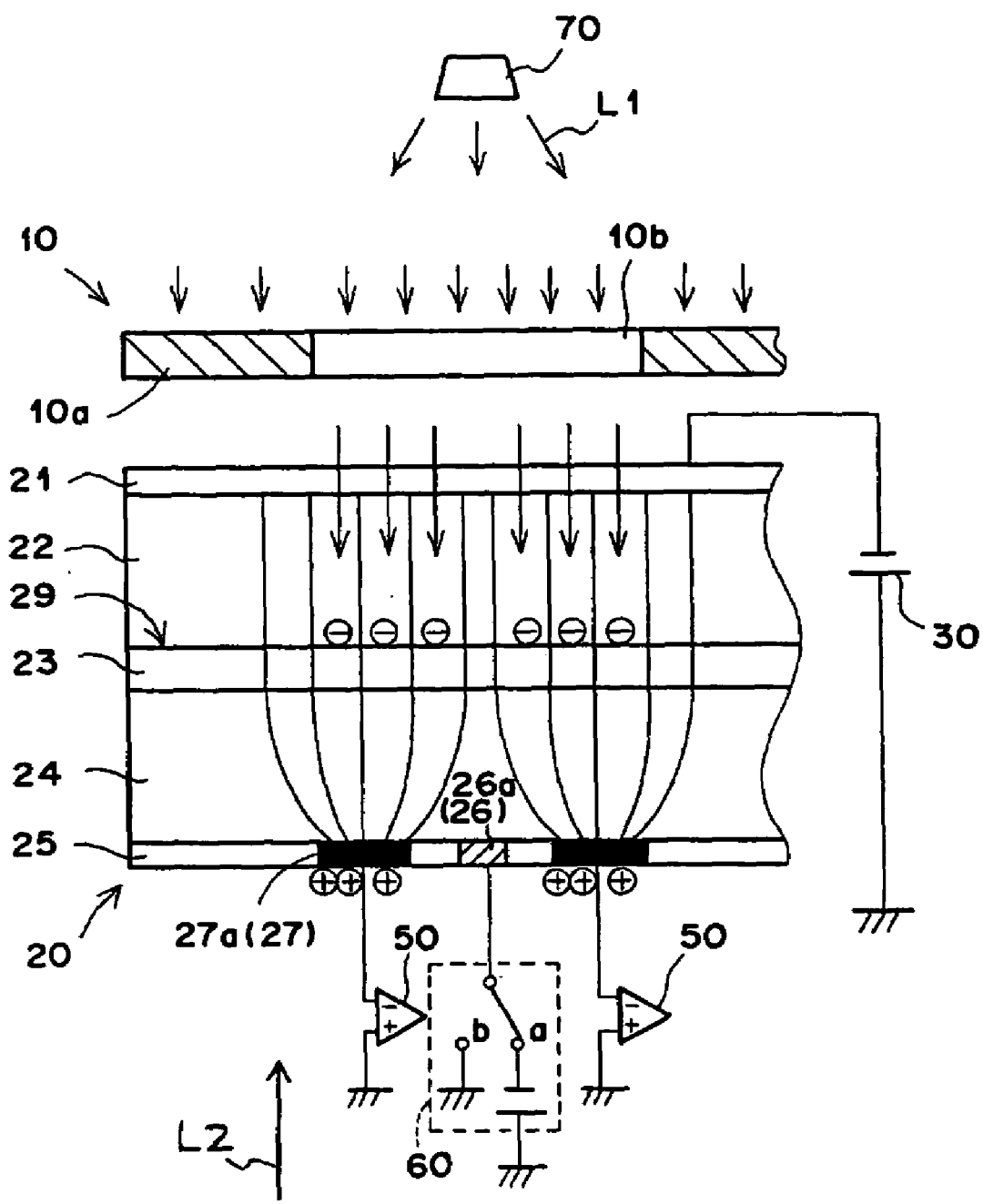
FIG. 1 is a schematic constitutional view of a radiation image recording and retrieving apparatus which adopts an image recording apparatus of the present invention.
Figure 2A:
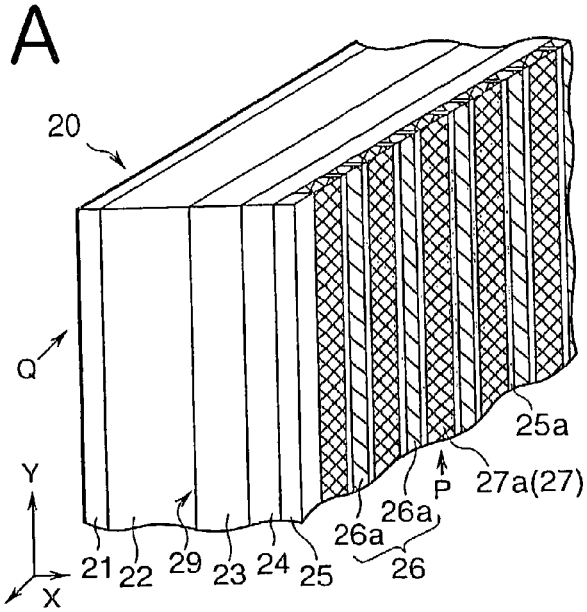
FIG. 2A is a perspective view of a solid state radiation detector for use in an embodiment of the present invention as shown in FIG. 1.
Figure 2B:
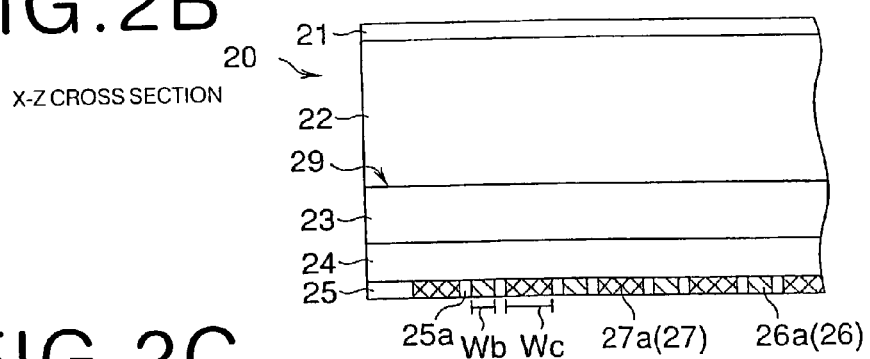
FIG. 2B is a cross-sectional view of an X-Z plane of the solid state radiation detector of FIG. 2A in a position as indicated by an arrow Q.
Figure 2C:
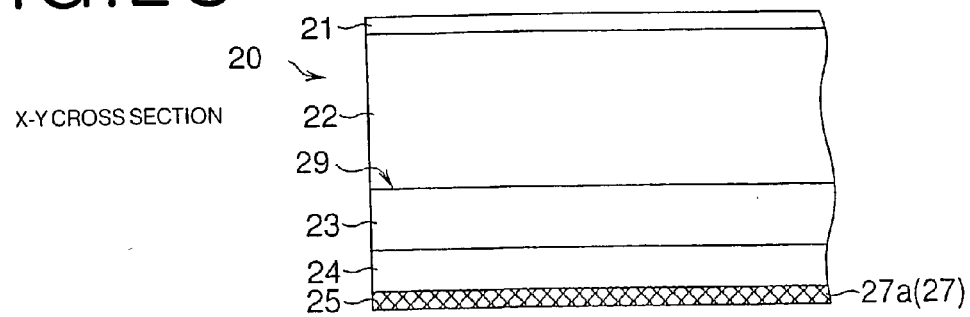
FIG. 2C is a cross-sectional view of an X-Y plane of the solid state radiation detector of FIG. 2A in a position as indicated by an arrow P.

FIG. 1 is a drawing that shows a schematic constitution of an embodiment of a radiation image recording and retrieving apparatus which adopts an image recording apparatus to embody an image recording method of the present invention, and FIGS. 2A through 2C are views showing a schematic constitution of a solid state radiation detector used in the radiation image recording and retrieving apparatus of the embodiment for recording a radiation image. Specifically, FIG. 2A is a perspective view thereof, FIG. 2B is a cross-sectional view of an X-Z plane thereof in a position indicated by an arrow Q, and FIG. 2C is a cross-sectional view of an X-Y plane thereof in a position indicated by an arrow P.

First, description will be made regarding a solid state radiation detector on which a radiation image is recorded by the radiation image recording and retrieving apparatus of the embodiment. A solid state radiation detector 20 shown in FIGS. 2A to 2C includes: a first electrode layer 21 which is transmissive of an electromagnetic wave for recording (such as X-rays; hereinafter referred to as "recording light") L1; a recording photoconductive layer 22 which takes on conductivity by receiving irradiation of the recording light L1 which passes through the first electrode layer 21; a charge transfer layer 23 acting substantially as an insulator with respect to electric charges for a latent image (negative electric charges, for example) and acting substantially as a conductor with respect to transported charges (positive electric charges according to the foregoing example) of the reverse polarity to the electric charges for a latent image; a retrieving photoconductive layer 24 which takes on conductivity by receiving irradiation of an electromagnetic wave for retrieval (hereinafter referred to as "retrieving light") L2; and a second electrode layer 25 having a first stripe electrode 26 composed of multiple elements 26a for generation of photoelectric charge pairs with respect to irradiation of the retrieving light L2 and a second stripe electrode 27 composed of multiple elements 27a for non-generation of the photoelectric charge pairs, the elements 26a and the elements 27a being alternately arranged substantially in parallel in the second electrode layer 25. The solid state radiation detector 20 is formed by stacking the foregoing constituents in accordance with the above order of enumeration.

Elements 26a have a width Wb and elements 27a have a width Wc. Spaces 25a between each of the elements 26a and elements 27a of the second electrode layer 25 are filled with a high-polymer material such as polyethylene with a small amount of pigment such as carbon black being dispersed therein, for example. The high-polymer material is supposed to possess a light shielding effect against the retrieving light L2. Moreover, the first stripe electrode 26 and the second stripe electrode 27 are electrically insulated from each other.

Moreover, the second stripe electrode 27 is coated with metal such as AL, Cr or the like, and thus formed to possess a light shielding effect against the retrieving light L2. The second stripe electrode 27 is arranged not to generate charge pairs for extracting signals inside the retrieving photoconductive layer 24 in positions corresponding to the elements 27a. Any material can be used to form the second stripe electrode 27 so far as it is conductive. Accordingly, the second stripe electrode 27 can be made of single metal such as gold, silver, chromium and platinum, or of an alloy such as indium oxide.

A material suitable for the recording photoconductive layer 22 is a photoconductive material including at least one of amorphous selenium (a-Se), lead (II) oxide or lead (II) iodide such as PbO or $PbI_2$, $Bi_{12}$ (Ge, Si)$O_{20}$, $Bi_2I_3$/organic polymer nanocomposite and the like, as a chief component thereof.

As a material for the charge transport layer 23, it is preferable that the material has a difference between the degree of mobility of the negative electric charges to be charged in the electrode layer 21 and the degree of mobility of the positive electric charges of the reverse polarity, for example, as large as possible (such as $10^2$ or larger, preferably $10^3$ or larger). Materials suitable for the charge transport layer 23 include organic compounds such as poly(N-vinylcarbazole) (PVK), N,N'-diphenyl-N,N'-bis(3-methylphenyl)-(1,1'-biphenyl)-4,4'-diamine (TPD) and discotic liquid crystal, TPD polymer (polycarbonate, polystyrene, PVK) dispersions, or semiconductor materials such as a-Se doped with 10 to 200 ppm of Cl. In particular, the organic compounds (PVK, TPD, discotic liquid crystal and the like) are preferred because of their light insensitivity. In addition, since the organic compounds generally possess small permittivity, it is possible to reduce capacities of the charge transport layer 23 and the retrieving photoconductive layer 24, thus enhancing signal extraction efficiency upon retrieval. Note that the foregoing "light insensitivity" refers to the phenomenon of taking on very little conductivity upon receiving irradiation of the recording light L1 or the retrieving light L2.

A material suitable for the retrieving photoconductive layer 24 is a photoconductive material including at least one of a-Se, Se—Te, Se—As—Te, nonmetal phthalocyanine, metal phthalocyanine, magnesium phthalocyanine (MgPc), phase II of vanadyl phthalocyanine (VoPc) and copper phthalocyanine (CuPc), as a chief component thereof.

A thickness of the recording photoconductive layer 22 is preferably set in a range from 50 μm to 1000 μm inclusive in order to absorb the recording light L1 sufficiently. In this example, the thickness is set to about 500 μm. Meanwhile, an aggregate thickness of the charge transport layer 23 and the retrieving photoconductive layer 24 is preferably set to ½ or less than the thickness of the recording photoconductive layer 22. Since responses upon retrieval are enhanced as the foregoing aggregate thickness becomes thinner, the aggregate thickness is preferably set to ⅒ or less, and more preferably to 1/20 or less.

A material suitable for the first stripe electrode of the electrode layer 21 and the electrode layer 25 includes, for example, a NESA film which is a conductive material coated on a transparent glass plate. In addition, an indium tin oxide (ITO) film, Idemitsu indium x-metal oxide ("IDIXO" (trade name); made by Idemitsu Kosan CO., Ltd.) which is an amorphous light-transmissive oxide film or the like can be also used by coating in a thickness range from 50 to 200 nm.

Next, description will be made regarding the radiation image recording and retrieving apparatus of the embodiment, which records and retrieves a radiation image by use of the solid state radiation detector 20.

As shown in FIG. 1, the radiation image recording and retrieving apparatus of the embodiment includes: the solid state radiation detector 20; recording light irradiating means 70 for irradiating the recording light onto the solid state radiation detector 20; direct-current voltage applying means 30 for applying a direct-current voltage between the first electrode layer 21 and the second stripe electrode 27 of the second electrode layer 25 when recording a radiation image by irradiation of the recording light by the recording light irradiating means 70; controlling voltage applying means 60 for applying a controlling voltage to control distribution of an electric field formed between the first electrode layer 21 and the second stripe electrode 27 when recording, and switching the first stripe electrode 26 to a grounded state upon retrieval; retrieving light irradiating means (not shown) for irradiating the retrieving light for retrieving the radiation image recorded on the solid state radiation detector 20; and image signal obtaining means 50 for detecting electric signals corresponding to the electric charges for a latent image accumulated in the electric accumulator 29, owing to generation of the charge pairs inside the retrieving photoconductive layer 24 caused by irradiation of the retrieving light from the retrieving light irradiating means.

An imaging object 10 is disposed above the first electrode layer 21. The imaging object 10 includes a light-shielding portion 10a which shields the recording light L1 irradiated from the recording light irradiating means 70, and a transmissive portion 10b which transmits the recording light. The recording light irradiating means 70 is designed to irradiate the recording light L1 uniformly onto the imaging object 10.

The retrieving light irradiating means (not shown) is designed to scan-expose the retrieving light L2 linearly in the longitudinal direction of the first and the second stripe electrodes 26 and 27 (the Y direction in FIG. 2A) while substantially orthogonalizing the retrieving light L2 with the both electrodes. During scanning exposure, either continuous light or pulse light may be irradiated.

The direct-current voltage applying means 30 is a direct-current voltage power source capable of applying a direct-current voltage of a predetermined magnitude between the first electrode layer 21 and the second stripe electrode 27 of the second electrode layer 25 when recording the radiation image.

The controlling voltage applying means 60 includes a direct-current voltage power source for applying the controlling voltage to the first stripe electrode 26 in order to control distribution of the electric field formed between the first electrode layer 21 and the second stripe electrode 27 by application of the direct-current voltage from the direct-current voltage applying means 30 when recording, and a switch for switching the first stripe electrode 26 to the grounded state upon retrieval.

The image signal obtaining means 50 is connected to the second stripe electrode 27 as illustrated in FIG. 1 for obtaining the electric signals corresponding to a quantity of the electric charges for a latent image accumulated in the electric accumulator 29. The image signal obtaining means 50 includes multiple current detection amplifiers which are connected to the elements 27a of the second stripe electrode 27.

Figure 3:
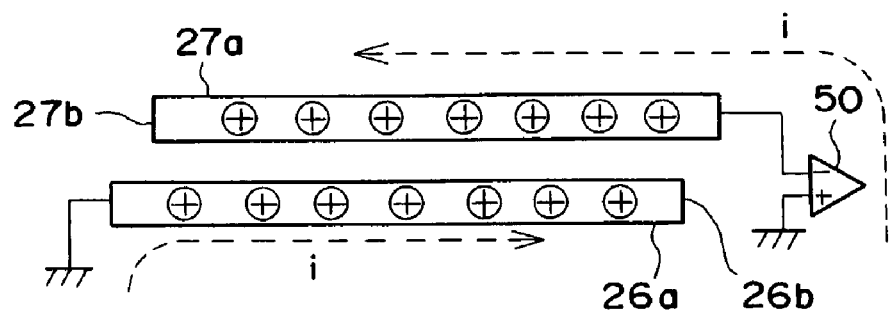
FIG. 3 is a diagram that describes electric currents flowing on each of the stripe electrodes when applying a direct-current voltage to the solid state radiation detector according to the embodiment shown in FIG. 1.

Meanwhile, in the present embodiment, one end of the second stripe electrode 27 unconnected to the image signal obtaining means 50 and one end of the first stripe electrode 26 in a position opposite from the one end of the second stripe electrode 27 are designed as open ends as shown in FIG. 3.

Here, when the direct-current voltage is applied between the first electrode layer 21 and the second stripe electrode 27 by the direct-voltage applying means 30, electric currents 'i' flow on each stripe electrode as shown in FIG. 3, owing to resistance of the first stripe electrode 26 and the second stripe electrode 27. There is a risk of discharge breakdown attributable to a potential difference incurred by the electric currents 'i', between an open end portion 26b, which is one end of the first stripe electrode 26 on the ungrounded side, and a part of the second stripe electrode 27 adjacent to the open end portion 26b. Moreover, there is also a risk of discharge breakdown attributable to a potential difference incurred similarly between an open end portion 27b of the second stripe electrode 27 and a part of the first stripe electrode 26.

Figure 4:
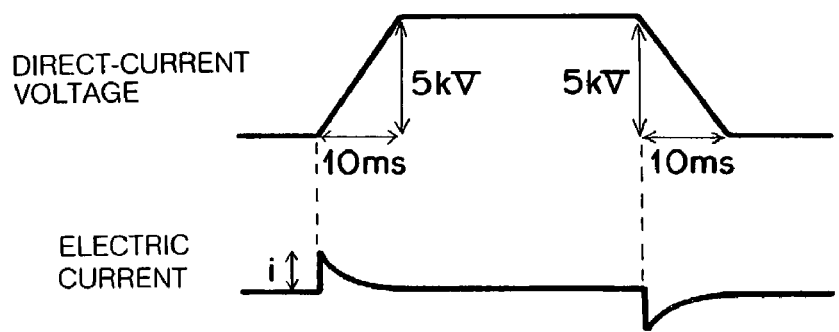
FIG. 4 is a diagram that describes variations with time at a leading edge and at a trailing edge of the direct-current voltage which is applied in the radiation image recording and retrieving apparatus according to the embodiment shown in FIG. 1 when recording, and for describing variations of the electric current flowing on each stripe electrode attributable to application of the direct-current voltage.

Accordingly, as shown in FIG. 4, the direct-current voltage to be applied by the direct-current voltage applying means 30 is provided with variation with time (500 V/ms) at a leading edge thereof, in order to avoid the discharge breakdown by reducing the electric currents 'i' flowing on each of the stripe electrodes.

Meanwhile, there is also a risk of discharge breakdown at the open end portions 26b and 27b of each of the stripe electrodes when discontinuing the direct-current voltage by the direct-current voltage applying means 30 as similar to the foregoing case. Accordingly, a trailing edge of the direct-current voltage is also provided with variation with time (500 V/ms) as shown in FIG. 4.

Next, description will be made regarding an operation of recording a radiation image on the solid state radiation detector 20 as an electrostatic latent image by use of the radiation image recording and retrieving apparatus of the embodiment having the above-described constitution, and an operation of retrieving the recorded electrostatic latent image. Note that negative electric charges and positive electric charges generated inside the recording photoconductive layer 22 by the recording light L1 are illustrated with circled "−" signs and "+" signs in the accompanying drawings.

First, when recording the electrostatic latent image on the solid state radiation detector 20, the direct-current voltage of a predetermined magnitude is applied between the first electrode layer 21 and the second stripe electrode 27 by the direct-current voltage applying means 30, whereby the first electrode layer 21 is negatively charged and the second stripe electrode is positively charged. In this event, since the leading edge of the voltage thus applied is provided with variation with time, discharge breakdown can be avoided. Meanwhile, the switch on the controlling voltage applying means 60 is switched to an "a" position, whereby the controlling voltage is applied to the first stripe electrode.

Moreover, as shown in FIG. 1, the above-described voltage application forms a U-shaped electric field between the first electrode layer 21 and each of the elements 27a of the second stripe electrode 27. Here, the electric potential of the first stripe electrode 26 is set closer to the electric potential of the first electrode layer in comparison with the electric potential of the second stripe electrode 27. Therefore, a potential valley is formed above the second stripe electrode 27.

Next, radiation is irradiated onto the imaging object 10. The radiation transmitted through the transmissive portion 10b of the imaging object 10 is irradiated onto the solid state radiation detector 20 as the recording light L1 bearing a radiation image of the imaging object 10. Positive and negative charge pairs are generated inside the recording photoconductive layer 22 of the solid state radiation detector 20 by irradiation of the recording light L1. Of those charge pairs, the negative electric charges move toward the electric accumulator 29 along the above-described distribution of the electric field and are accumulated as the electric charges for a latent image. In this event, since the potential valley is formed above the second stripe electrode 27 as previously described, it is possible to localize and accumulate more electric charges of a latent image onto the corresponding positions of the electric accumulator 29.

On the other hand, the positive electric charges generated inside the recording photoconductive layer 22 rapidly move toward the first electrode layer 21 and are subsequently coupled with the negative electric charges charged on the first electrode layer 21 by application of the direct-current voltage at an interface between the first electrode layer 21 and the recording photoconductive layer 22, whereby the positive electric charges eventually disappear. Meanwhile, since the recording light L1 is not transmitted through the light-shielding portion 10a of the imaging object 10, no changes occur in a portion of the solid state radiation detector 20 shielded by the light-shielding portion 10a of the imaging object 10.

In this way, it is possible to accumulate the electric charges corresponding to the image of the imaging object in the electric accumulator 29 existing at an interface between the recording photoconductive layer 22 and the charge transport layer 23 by irradiating the radiation onto the imaging object 10. The quantity of the electric charges for a latent image to be accumulated is substantially proportional to the dosage of the radiation incident onto the solid state radiation detector 20 after passing through the imaging object 10. Accordingly, the electric charges for a latent image bear the electrostatic latent image, whereby the electrostatic image is recorded on the solid state radiation detector 20.

Then, after accumulating the electric charges for a latent image in the electric accumulator 20, application of the direct-current voltage by the direct-current voltage applying means 30 is discontinued. Meanwhile, the switch in the controlling voltage applying means 60 is switched to a "b" position after the controlling voltage power source is stopped. At this time, since the trailing edge of the direct-current voltage is provided with variation with time as previously described, discharge breakdown can be avoided.

Figure 5:
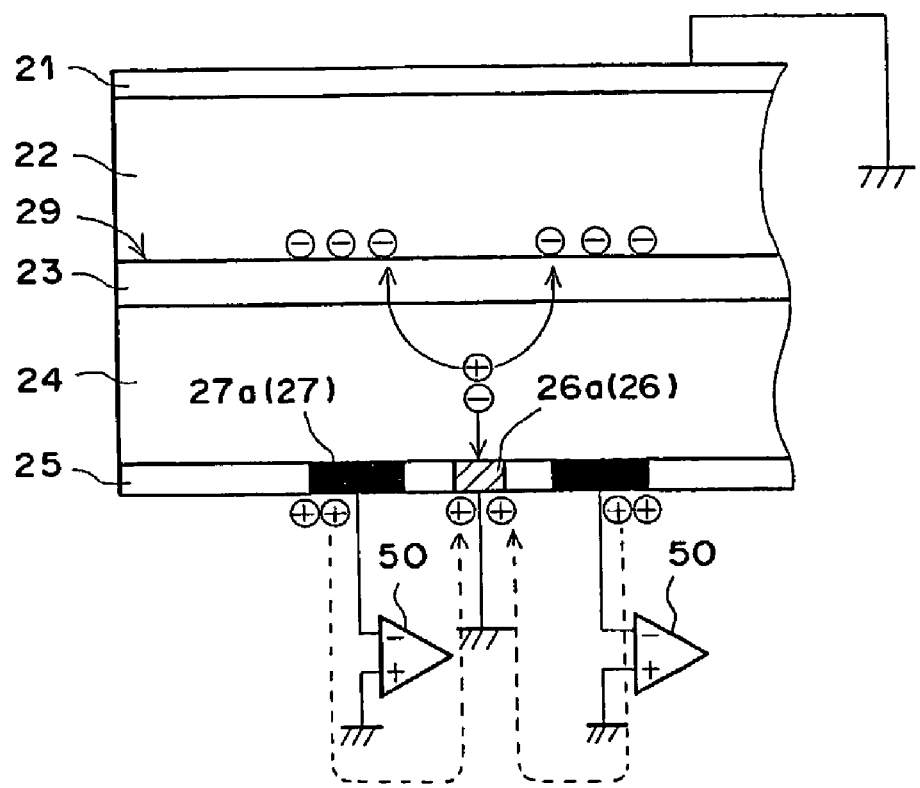
FIG. 5 is a drawing that shows a process of retrieving electric charges for a latent image out of the solid state radiation detector in the radiation image recording and retrieving apparatus according to the embodiment shown in FIG. 1.

Next, description will be made regarding a process of retrieving the electrostatic latent image recorded on the solid state radiation detector 20 in accordance with the foregoing process, with reference to FIG. 1 and FIG. 5. Note that negative electric charges and positive electric charges generated inside the retrieving photoconductive layer 24 by the retrieving light L2 are illustrated with circled "−" signs and "+" signs in the same manner as in the above-described recording process.

Upon retrieving the electrostatic latent image out of the solid state radiation detector 20, the voltage supply by the direct-current applying means 30 is discontinued, whereby the first electrode layer is set to the grounded state as described above. Meanwhile, the first stripe electrode 26 is set to the grounded state because the switch in the controlling voltage applying means 60 is switched to the "b"

position. Accordingly, the first stripe electrode 26 and the second stripe electrode 27 are set to the same electric potential (the grounded potential).

Next, when the retrieving light L2 is irradiated from the retrieving light irradiating means (not shown) onto the retrieving photoconductive layer 24, the electric charges for a latent image in positions corresponding to two elements 27a of the second stripe electrode 27, that is, in positions above the both elements 27a, are coupled with positive electric charges which are charged on the two elements 27a, whereby the electric charges for a latent image are serially retrieved. In other words, as shown in FIG. 5, electricity is discharged from the element 26a of the first stripe electrode located in the center of a pixel toward the electric charges for a latent image corresponding to (existing above) the two adjacent elements 27a, whereby retrieval progresses. Note that it is preferable to set the widths of the elements 27a wider than the width of the element 26a in order to extract more signal electric charges.

Figure 6A:
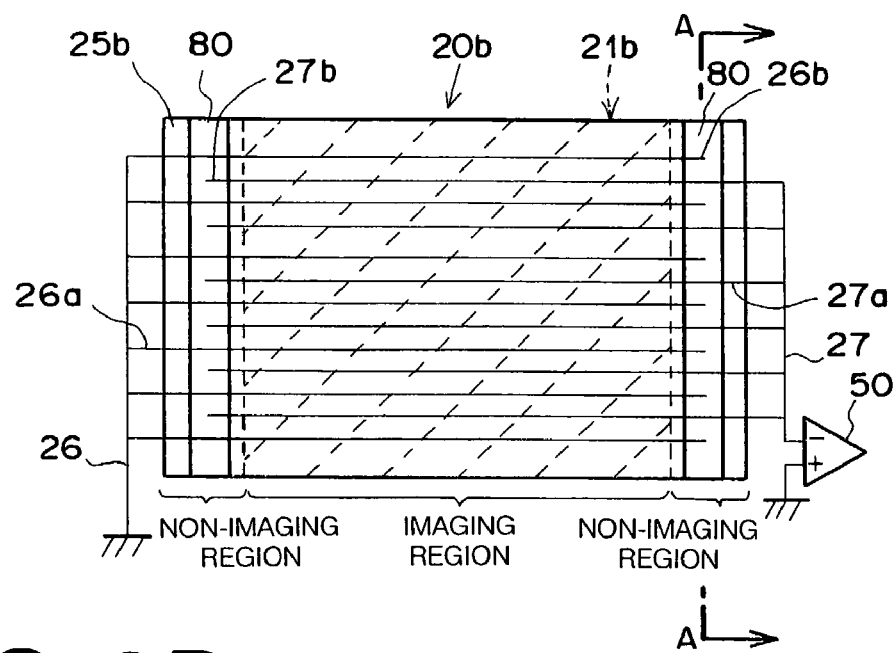
FIGS. 6A and 6B are drawings that show one embodiment of a solid state radiation detector which adopts an image recording medium according to the present invention.
Figure 6B:
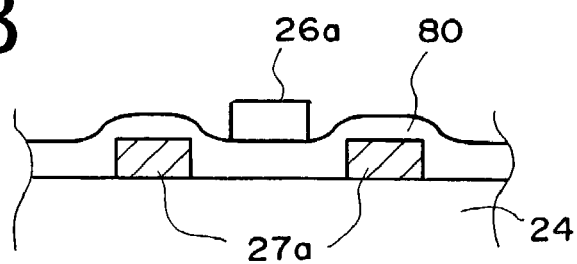

Next, description will be made regarding an embodiment of a solid state radiation detector adopting an image recording medium of the present invention. FIGS. 6A and 6B are drawings that show a schematic constitution of the solid state radiation detector of this embodiment. FIG. 6A is a plan view of the solid state radiation detector 20b of the embodiment viewed from the second electrode layer 25b side, and FIG. 6B shows a cross section of a portion of an insulating layer 80 of the solid state radiation detector 20b of the embodiment, which will be described later. It should be noted that constituents of the solid state radiation detector 20b of this embodiment that are similar to those used in the solid state radiation detector 20 of the precedent embodiment will be denoted with the same reference numerals, and description thereto will be omitted unless particularly necessary.

The solid state radiation detector 20b of the embodiment has different structures in the first electrode layer 21 and in the second electrode layer 25 from the solid state radiation detector 20 used in the previous embodiment. As for the other layers, the solid state radiation detector 20b has similar structures and functions to those in the solid state radiation detector 20.

As shown in FIG. 6A, a first electrode layer 21b of the solid state radiation detector 20b is provided in a region excluding both end portions of the solid state radiation detector 20b (the shaded region in FIG. 6A). Accordingly, the region provided with the first electrode layer 21b is defined as an imaging region which can record a radiation image. On the other hand, regions where the first electrode layer 21b is not provided are non-imaging regions that do not record the radiation image.

Moreover, as shown in FIGS. 6A and 6B, insulating layers 80 are provided on the non-imaging regions on a second electrode layer 25b of the solid state radiation detector 20b. The insulating layers serve to prevent discharge between the open end 26b of the first stripe electrode 26 and the portion of the second stripe electrode 27 adjacent thereto. The insulating layers also serve to prevent discharge between the open end 27b of the second stripe electrode 27 and the portion of the first stripe electrode 26 adjacent thereto. Since the open end portions 26b and 27b of the respective stripe electrodes 26 and 27 are insulated respectively from the first stripe electrode 26 and the second stripe electrode 27 by the insulating layers 80, it is possible to avoid discharge breakdown of the electrodes incurred by application of a direct-current voltage when recording.

Furthermore, the discharge breakdown does not just occur when applying the direct-current voltage. There is also a risk of discharge breakdown when irradiating radiation. The discharge breakdown when irradiating the radiation may be caused by sharp variation of electric potential at the first stripe electrode 26 and the second stripe electrode 27, which is attributable to generation of charge pairs inside the recording photoconductive layer 22 by the irradiation of the radiation. Since electric currents flow on the first stripe electrode 26 and the second stripe electrode 27 in accordance with the sharp variation of the electric potential thereof, the open end portions 26b and 27b of the respective stripe electrodes 26 and 27 may suffer from the discharge breakdown in a similar manner to that which occurs when applying the direct-current voltage. It is not possible to avoid the discharge breakdown incurred when irradiating the radiation leading edges and trailing edges of the direct-current voltage and a controlling voltage are provided with variation with time, as in the solid state radiation detector of the previous embodiment. However, by use of the solid state radiation detector 20b according to the present embodiment, the discharge breakdown of the electrodes when irradiating the radiation can be also avoided because the open end portions 26b and 27b of the respective stripe electrodes 26 and 27 are insulated by the insulating layers 80. In addition, since the insulating layers 80 are only provided in the non-imaging regions, provision of the insulating layers 80 does not incur degradation of signal detection efficiency.

In the solid state radiation detector 20b according to the embodiment, the insulating layers 80 are provided on both a first end portion region including the open end portion 26b of the first stripe electrode 26 and a part of the second stripe electrode 27 adjacent to the open end portion 26b, and on a second end portion region including the open end portion 27b of the second stripe electrode 27 and a part of the first stripe electrode 26 adjacent to the open end portion 27b. However, the insulating layer 80 may be provided on only one of the end portion regions.

Further, the vertical positional relationship between element 26a of the first stripe electrode 26 and the second element 27a of the second stripe electrode 27, shown in FIG. 6B, may be reversed.

Figure 7A:
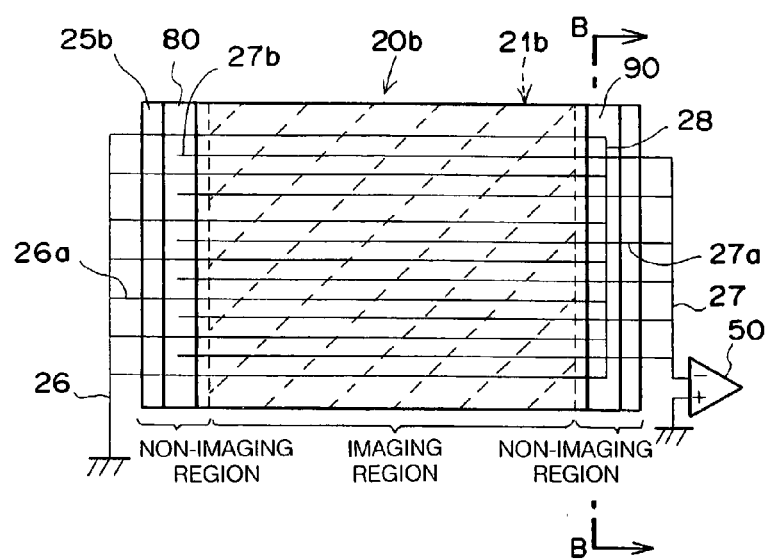
FIGS. 7A and 7B are drawings that show an alternate embodiment of a solid state radiation detector which adopts an image recording medium according to the present invention.

Still further, a common electrode may be formed by connecting the open ends of each of the elements 26a of the first stripe electrode 26 to each other, as shown in FIG. 7A. However, in the case that the open ends of each of the elements 26a are connected with each other as described above, an insulating layer 90 needs to be provided to insulate the line 28 that connects the open ends from the second stripe electrode 27. A cross sectional view of the insulating layer 90 taken along the line B-B of FIG. 7A is shown in FIG. 7B.

Figure 7B:
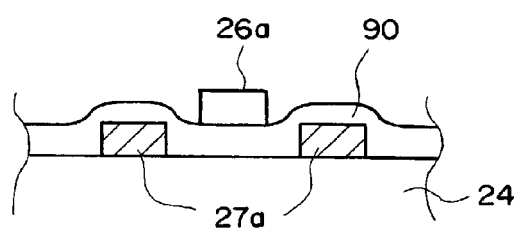

The vertical positional relationship between element 26a of the first stripe electrode 26 and the second element 27a of the second stripe electrode 27, shown in FIG. 7B, may be reversed.

Moreover, the above-described solid state radiation detectors 20 and 20b are designed to provide the charge transport layer between the recording photoconductive layer and the retrieving photoconductive layer in order to form the electric accumulator at the interface between the recording photoconductive layer and the charge transport layer. However, in the present invention, the charge transport layer may be substituted by a trap layer. When the trap layer is provided, the electric charges for a latent image are captured by the trap layer, whereby the electric charges for a latent image are accumulated inside the trap layer, or on an interface between the trap layer and the recording photoconductive layer.

What is claimed is:

1. An image recording medium comprising:
a first electrode layer which transmits an electromagnetic wave for recording,
a recording photoconductive layer which takes on conductivity by receiving irradiation of the electromagnetic wave for recording,
an electric accumulator which accumulates electric charges for a latent image generated on the recording photoconductive layer,
a retrieving photoconductive layer which takes on conductivity by receiving irradiation of an electromagnetic wave for retrieval, and
a second electrode layer to which the electromagnetic wave for retrieval is irradiated, the second electrode layer comprising a first stripe electrode including a plurality of first line electrodes for generation of photoelectric charge pairs with respect to irradiation of the electromagnetic wave for retrieval and a second stripe electrode including a plurality of second line electrodes for non-generation of the photoelectric charge pairs with respect to the electromagnetic wave for retrieval, the first stripe electrode and the second stripe electrode being alternately arranged approximately in parallel, and the image recording medium being formed by stacking the foregoing constituents in accordance with the above order of enumeration, wherein:
the first line electrodes each include an open end and a connected end, and the first stripe electrode further includes a first connection line which connects the connected ends of the first line electrodes;
the second line electrodes each include an first end and a second end, and the second electrode further includes a second connection line which connects the first ends of the second line electrodes and connects the second ends of the second line electrodes; and
an insulating layer is provided between the first stripe electrode and the second stripe electrode for insulating the first stripe electrode and the second stripe electrode, the insulating layer covering at least an upper surface of the first line electrodes or an upper surface of the second line electrodes, only at a first end region including the open ends of the first line electrodes and a portion of the second line electrodes adjacent to the open ends of the first line electrodes, and a second end region including an intersection of the connection line of one of the first and second stripe electrodes and the line electrodes of the other one of the first and second stripe electrodes.

2. An image recording medium comprising:
a first electrode layer which transmits an electromagnetic wave for recording,
a recording photoconductive layer which takes on conductivity by receiving irradiation of the electromagnetic wave for recording,
an electric accumulator which accumulates electric charges for a latent image generated on the recording photoconductive layer,
a retrieving photoconductive layer which takes on conductivity by receiving irradiation of an electromagnetic wave for retrieval, and
a second electrode layer to which the electromagnetic wave for retrieval is irradiated, the second electrode layer comprising a first stripe electrode including a plurality of first line electrodes for generation of photoelectric charge pairs with respect to irradiation of the electromagnetic wave for retrieval and a second stripe electrode including a plurality of second line electrodes for non-generation of the photoelectric charge pairs with respect to the electromagnetic wave for retrieval, the first line electrodes and the second line electrodes being alternately arranged approximately in parallel, and the image recording medium being formed by stacking the foregoing constituents in accordance with the above order of enumeration, wherein:
the first line electrodes each include an first end and a second end, and the first stripe electrode further includes a connection line which connects the first ends of the first line electrodes and connects the second ends of the first line electrodes;
the second line electrodes each include an open end and a connected end, and the second electrode further includes a connection line which connects the connected ends of the second line electrodes; and
an insulating layer is provided between the first stripe electrode and the second stripe electrode for insulating the first stripe electrode and the second stripe electrode, the insulating layer covering at least an upper surface of either the first line electrodes or the second line electrodes, only at a first end region including the open ends of the second stripe electrode and a portion of the first line electrodes adjacent to the open ends of the second line electrodes, and a second end region including an intersection of the connection line of one of the first and second stripe electrodes and the line electrodes of the other one of the first and second stripe electrodes.

3. An image recording medium comprising:
a first electrode layer which transmits an electromagnetic wave for recording,
a recording photoconductive layer which takes on conductivity by receiving irradiation of the electromagnetic wave for recording,
an electric accumulator which accumulates electric charges for a latent image generated on the recording photoconductive layer,
a retrieving photoconductive layer which takes on conductivity by receiving irradiation of an electromagnetic wave for retrieval, and
a second electrode layer to which the electromagnetic wave for retrieval is irradiated, the second electrode layer comprising a first stripe electrode including a plurality of first line electrodes for generation of photoelectric charge pairs with respect to irradiation of the electromagnetic wave for retrieval and a second stripe electrode a plurality of second line electrodes for non-generation of the photoelectric charge pairs with respect to the electromagnetic wave for retrieval, the first line electrodes and the second line electrodes being alternately arranged approximately in parallel, and the image recording medium being formed by stacking the foregoing constituents in accordance with the above order of enumeration, wherein:
one end of each of the first line electrodes and one end of each of the second line electrodes located opposite from said one end of the first line electrodes are open ends; and
an insulating layer is provided between the first stripe electrode and the second stripe electrode for insulating the first stripe electrode and the second stripe electrode, covering at least an upper surface of the first line electrodes or the second line electrodes, only in at least one of two end regions, the first end region including the open ends of the first line electrodes and a portion of the second line electrodes adjacent to said open ends of the first line electrodes, and the second end region including the open ends of the second line electrodes and a portion of the first line electrodes adjacent to said open ends of the second line electrodes.

4. The image recording medium according to any one of claims 1 to 3, wherein the first and second end regions are non-image regions.

* * * * *